(12) United States Patent
Chen et al.

(10) Patent No.: US 8,026,549 B2
(45) Date of Patent: Sep. 27, 2011

(54) LDMOS WITH N-TYPE ISOLATION RING AND METHOD OF FABRICATING THE SAME

(75) Inventors: Chin-Lung Chen, Hsinchu County (TW); Chun-Ching Yu, Taoyuan County (TW); Jung-Ching Chen, Hsinchu (TW); Ming-Tsung Tung, Hsinchu (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 49 days.

(21) Appl. No.: 12/263,108

(22) Filed: Oct. 31, 2008

(65) Prior Publication Data

US 2010/0109081 A1    May 6, 2010

(51) Int. Cl.
*H01L 29/66* (2006.01)
(52) U.S. Cl. .................................... 257/335; 257/343
(58) Field of Classification Search .................. 257/335, 257/343

See application file for complete search history.

(56) References Cited

U.S. PATENT DOCUMENTS

| | | | | |
|---|---|---|---|---|
| 5,286,995 A * | 2/1994 | Malhi | ............................ | 257/549 |
| 5,728,607 A * | 3/1998 | Shibib | ............................ | 438/135 |
| 6,489,653 B2 * | 12/2002 | Watanabe et al. | ............ | 257/343 |
| 6,580,131 B2 | 6/2003 | Huang et al. | | |
| 6,831,331 B2 * | 12/2004 | Kitamura et al. | ............. | 257/343 |
| 6,924,531 B2 | 8/2005 | Chen et al. | | |
| 2003/0228732 A1 * | 12/2003 | Efland et al. | ................. | 438/232 |
| 2007/0075363 A1 * | 4/2007 | Otake et al. | .................... | 257/335 |

* cited by examiner

*Primary Examiner* — A. Sefer
*Assistant Examiner* — Allen Parker
(74) *Attorney, Agent, or Firm* — Winston Hsu; Scott Margo

(57) ABSTRACT

A semiconductor device and an IC chip are described. The deep N-well region is configured in a substrate. The P-well region surrounds a periphery of the deep N-well region. The gate structure is disposed on the substrate of the deep N-well region. The P-body region is configured in the deep N-well region at one side of the gate structure. The first N-type doped region is configured in the P-body region. The second N-type doped region is configured pin the deep N-well region at the other side of the gate structure. The first isolation structure is disposed between the gate structure and the second N-type doped region. The N-type isolation ring is configured in the deep N-well region and corresponding to an edge of the deep N-well region, wherein a doping concentration of the N-type isolation ring is higher than that of the deep N-well region.

16 Claims, 5 Drawing Sheets

LDMOS WITH N-TYPE ISOLATION RING AND METHOD OF FABRICATING THE SAME

BACKGROUND OF THE INVENTION

1. Field of the Invention

The present invention generally relates to a semiconductor device and an integrated circuit chip (IC chip), and in particular, to a laterally diffused metal oxide semiconductor (LDMOS) device and an IC chip including the same.

2. Description of Related Art

Laterally diffused metal oxide semiconductor (LDMOS) is a power source device commonly used in semiconductor processes. The LDMOS can provide a higher breakdown voltage ($V_{bd}$) and has a lower on-resistance ($R_{on}$) during operation. Hence, the LDMOS is normally used as a high voltage (HV) device in power management IC (PMIC). The CMOS-DMOS device (CDMOS) process and the HV LDMOS analog process are the process platform for the power management IC.

A conventional PMIC involves HVPMOS and LDNMOS therein. Owing to drain/source on-resistance ($R_{dson}$) of the HVPMOS being 3-4 times higher than that of the LDNMOS, the layout area of the HVPMOS is designed much larger than that of the LDNMOS in the same IC to comply with impedance matching and to match rising time and falling time in response. In general, the LDNMOS having a lower $R_{dson}$ during operation is usually substituted for the large-scale HVPMOS, that is, a plurality of LDNMOS is included in the PMIC, so as to reduce the layout area of the PMIC chip. However, the source of the LDNMOS which is substituted for the HVPMOS is placed under a relatively high voltage during operation, and therefore, leakage current from the source to the substrate arises due to the difference of electric potential therebetween.

SUMMARY OF THE INVENTION

Accordingly, the present invention is directed to a semiconductor device with an isolation ring.

The present invention is also directed to an IC chip, wherein leakage current can be prevented effectively.

The semiconductor device of the present invention includes a deep N-well region, a P-well region, a gate structure, a P-body region, a first N-type doped region, a second N-type doped region, a first isolation structure and an N-type isolation ring. The deep N-well region is configured in a substrate. The P-well region surrounds a periphery of the deep N-well region. The gate structure is disposed on the substrate of the deep N-well region. The P-body region is configured in the deep N-well region at one side of the gate structure. The first N-type doped region is configured in the P-body region. The second N-type doped region is configured in the deep N-well region at the other side of the gate structure. The first isolation structure is disposed between the gate structure and the second N-type doped region. The N-type isolation ring is configured in the deep N-well region and corresponding to an edge of the deep N-well region, wherein a doping concentration of the N-type isolation ring is higher than that of the deep N-well region.

According to an embodiment of the present invention, the semiconductor device further includes an N-drift region configured under the first isolation structure.

According to an embodiment of the present invention, the semiconductor device further includes an N-type lightly doped region configured between the gate structure and the first N-type doped region.

According to an embodiment of the present invention, the semiconductor device further includes a P-type guard ring configured in the P-well region. A doping concentration of the P-type guard ring is higher than that of the P-well region, for example.

According to an embodiment of the present invention, the semiconductor device further includes a second isolation structure disposed between the P-body region and the P-well region. The N-type isolation ring is, for example, configured under the second isolation structure.

According to an embodiment of the present invention, the N-type isolation ring is doped with phosphorus or arsenic.

According to an embodiment of the present invention, the semiconductor device further includes a P-type doped region configured in the P-body region and contiguous to the first N-type doped region.

The IC chip of the present invention includes a substrate, a CMOS device and an LDNMOS device. The substrate has a first area and a second area, wherein the first and the second areas are separated from each other. The CMOS device is disposed in the first area. The CMOS device includes an N-well region configured in the substrate, an NMOS transistor disposed on the substrate outside of the N-well region, and a PMOS transistor disposed on the substrate of the N-well region. The LDNMOS device is disposed in the second area. The LDNMOS device includes a deep N-well region, a P-well region, a gate structure, a P-body region, a first N-type doped region, a second N-type doped region, a first isolation structure and an N-type isolation ring. The deep N-well region is configured in a substrate. The P-well region surrounds a periphery of the deep N-well region. The gate structure is disposed on the substrate of the deep N-well region. The P-body region is configured in the deep N-well region at one side of the gate structure. The first N-type doped region is configured in the P-body region. The second N-type doped region is configured in the deep N-well region at the other side of the gate structure. The first isolation structure is disposed between the gate structure and the second N-type doped region. The N-type isolation ring is configured in the deep N-well region and corresponding to an edge of the deep N-well region, wherein a doping concentration of the N-type isolation ring is higher than that of the deep N-well region.

According to an embodiment of the present invention, a dopant, a doping concentration and a doping depth of the N-type isolation ring are substantially identical to those of the N-well region, respectively.

According to an embodiment of the present invention, the LDNMOS device further includes an N-drift region configured under the first isolation structure. A dopant, a doping concentration and a doping depth of the N-type isolation ring are, for example, substantially identical to those of the N-drift region, respectively.

According to an embodiment of the present invention, the LDNMOS device further includes an N-type lightly doped region configured between the gate structure and the first N-type doped region.

According to an embodiment of the present invention, the LDNMOS device further includes a P-type guard ring configured in the P-well region. A doping concentration of the P-type guard ring is higher than that of the P-well region, for example.

According to an embodiment of the present invention, the LDNMOS device further includes a second isolation structure disposed between the P-body region and the P-well region. The N-type isolation ring is, for example, configured under the second isolation structure.

According to an embodiment of the present invention, the N-type isolation ring is doped with phosphorus or arsenic.

According to an embodiment of the present invention, the LDNMOS device further includes a P-type doped region configured in the P-body region and contiguous to the first N-type doped region.

As mentioned above, the semiconductor device of the present invention includes the N-type isolation ring with the higher doping concentration configured within the border of the deep N-well region. The lateral leakage current can be prevented by the disposition of the N-type isolation ring surround the device, and thereby high side ability is improved and the performance of the device is enhanced.

Moreover, the IC chip of the present invention includes the N-type isolation ring which is simultaneously fabricated with N-drift region or with N-well region in the same process. Therefore, the process is simple and can be integrated with the current CDMOS process. In addition, the IC chip of the present invention can be applicable to all power management ICs, and thus is quite competitive.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
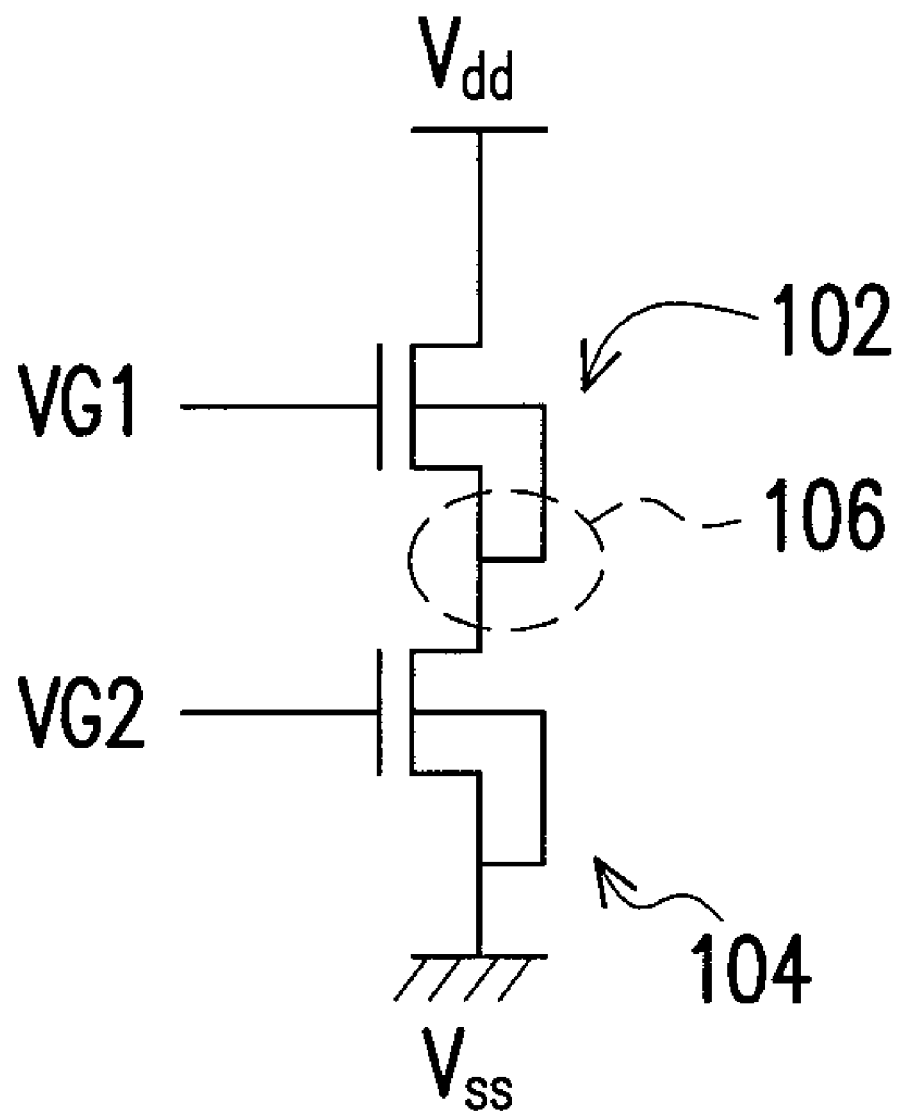
FIG. 1 depicts, in a circuit diagram, a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 depicts, in a circuit diagram, a semiconductor device according to an embodiment of the present invention. For illustration purposes, the following disclosure is described in terms of two devices, which are illustrated only as an exemplary example, and should not be adopted for limiting the scope of the present invention. The number and the arrangement of the devices are not particularly limited by the present invention.

Referring to FIG. 1, devices 102 and 104 are, for example, LDNMOS, respectively. The devices 102 and 104 can be operated independently by applying a gate voltage VG1 to the gate of the device 102 and applying a gate voltage VG2 to the gate of the device 104. The drain of the device 102 is coupled to a high potential terminal, such as a power voltage $V_{dd}$. The source of the device 104 is coupled to a low potential terminal, such as a grounded voltage $V_{ss}$. The source of the device 102 is coupled with the drain of the device 104 so as to connect the devices 102 and 104. Since the source of the device is not grounded and is applied to a high voltage, as shown in the region 106, an isolation ring is deployed in the substrate to surround the devices and thereby isolate the passage of leakage current in the embodiments of the present invention. In an embodiment, the isolation ring is an annular configuration with the higher concentration deployed in the deep well region to surround the devices, which is formed by using doping process. Thus, the embodiments in the present invention can achieve the improvement in high side ability by diminishing the leakage current the substrate due to the punch-through effect, so as to enhance the performance of the device.

Figure 2A:
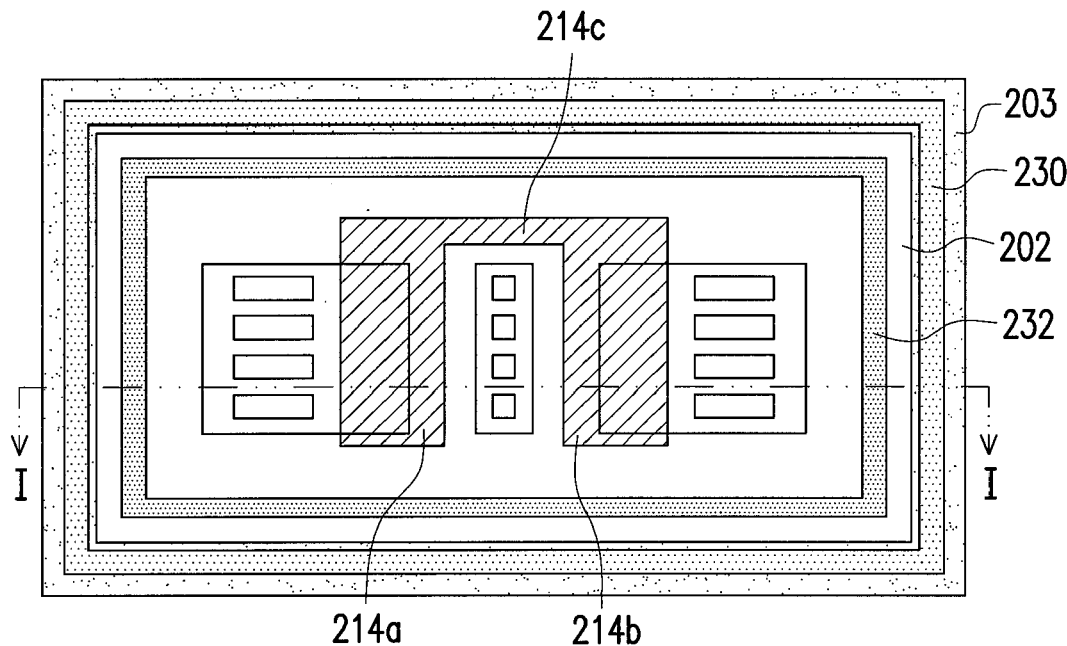
FIG. 2A schematically illustrates a top view of a semiconductor device according to an embodiment of the present invention.
Figure 2B:
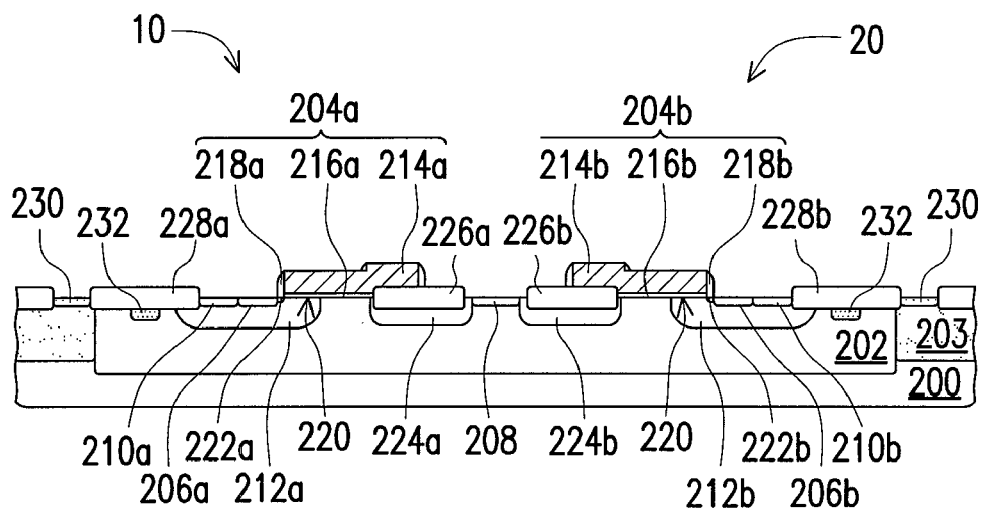
FIG. 2B is a schematic, cross-sectional diagram of the semiconductor device shown in FIG. 2A along line I-I.
Figure 3A:
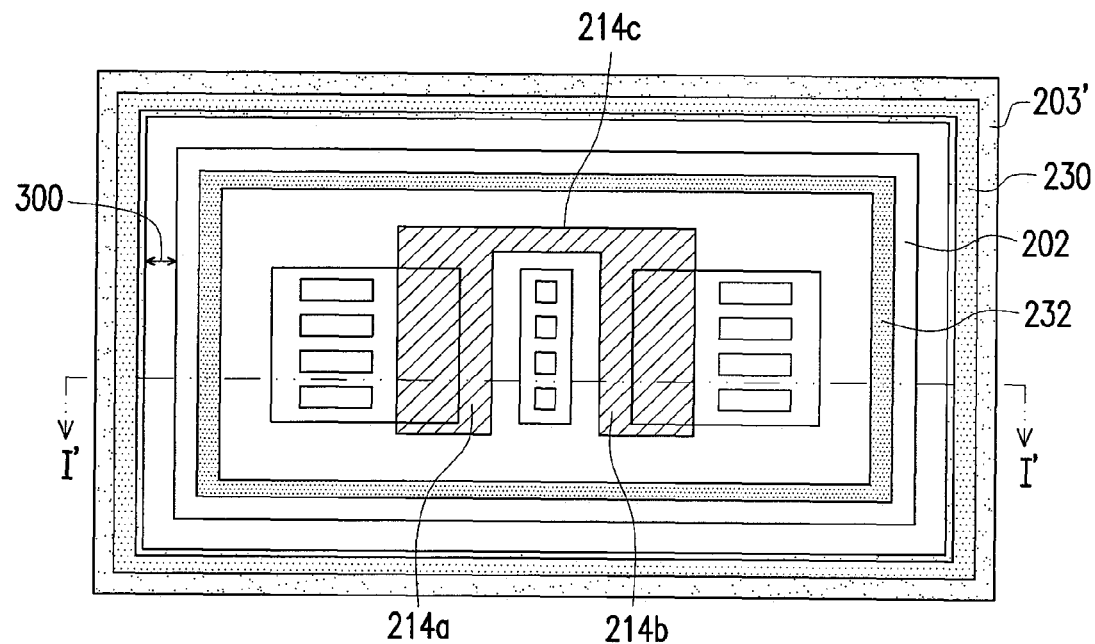
FIG. 3A schematically illustrates a top view of a semiconductor device according to another embodiment of the present invention.
Figure 3B:
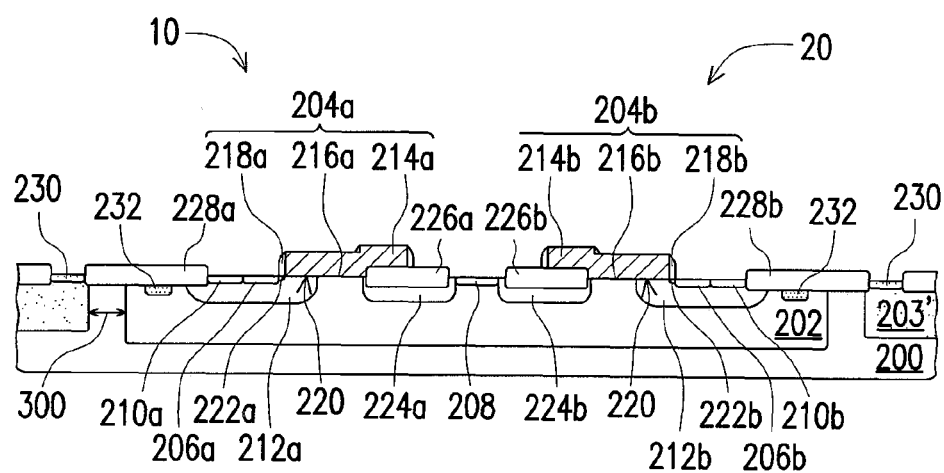
FIG. 3B is a schematic, cross-sectional diagram of the semiconductor device shown in FIG. 3A along line I'-I'.

The semiconductor device according to embodiments of the present invention is then illustrated with a schematic top view and a cross-sectional diagram. FIG. 2A schematically illustrates a top view of a semiconductor device according to an embodiment of the present invention. FIG. 2B is a schematic, cross-sectional diagram of the semiconductor device shown in FIG. 2A along line I-I. FIG. 3A schematically illustrates a top view of a semiconductor device according to another embodiment of the present invention. FIG. 3B is a schematic, cross-sectional diagram of the semiconductor device shown in FIG. 3A along line I'-I'. The identical elements shown in FIGS. 2A, 2B, 3A and 3B are designated with the same reference numbers, and detailed descriptions of the same or like elements are omitted hereinafter.

Referring concurrently to FIGS. 2A and 2B, the semiconductor device of the present invention includes LDNMOS devices 10 and 20. In this embodiment, the LDNMOS device 10 and the LDNMOS device 20 are respectively configured on a P-type substrate 200. A deep N-well region 202 and a P-well region 203 are configured in the substrate 200.

The deep N-well region 202 may be a high voltage deep N-well region (HVDNW). In an embodiment, the deep N-well region 202 is implanted by phosphorus, and the energy of implantation is about 1200 keV-2400 keV with the dosage of about $10^{11}/cm^2$-$10^{13}/cm^2$. In this exemplary example, the energy of implantation for forming the deep N-well region 202 is about 1800 keV, and the dosage thereof is about $10^{12}/cm^2$.

The P-well region 203 surrounds the periphery of the deep N-well region 202. In an embodiment, as shown in FIGS. 2A and 2B, the P-well region 203 is contiguous to the outer profile of the deep N-well region 202. In another embodiment, as shown in FIGS. 3A and 3B, the P-well region 203' surrounds the outer profile of the deep N-well region 202 with an interval 300 therebetween. In an embodiment, the P-well region 203 is implanted by boron, and the energy of implantation is about 120 keV-240 keV with the dosage of about $1.5 \times 10^{12}/cm^2$-$1.5 \times 10^{14}/cm^2$. In this exemplary example, the energy of implantation for forming the P-well region 203 is about 180 keV, and the dosage thereof is about $1.5 \times 10^{13}/cm^2$.

The LDNMOS device 10 includes a gate structure 204a, a first N-type doped region 206a, a second N-type doped region 208, a P-type doped region 210a and a P-body region 212a. The LDNMOS device 20 includes a gate structure 204b, a first N-type doped region 206b, the second N-type doped region 208, a P-type doped region 210b and a P-body region 212b.

More specifically, the P-body regions 212a and 212b are respectively configured in the deep N-well region 202. In an embodiment, the P-body regions 212a and 212b are implanted by boron.

The first N-type doped region 206a and 206b, such as N+ doped regions, are respectively configured in the P-body regions 212a and 212b. The first N-type doped region 206a and 206b serve as source regions of the LDNMOS devices 10 and 20, respectively. In an embodiment, the first N-type doped region 206a and 206b are implanted by phosphorus.

The second N-type doped region 208 may be an N+ doped region configured in the deep N-well region 202 and between the P-body regions 212a and 212b. The second N-type doped region 208 serves as a common drain region of the LDNMOS devices 10 and 20. In an embodiment, the second N-type doped region 208 is implanted by phosphorus.

The P-type doped region 210a and 210b, such as P+ doped regions, are respectively configured in the P-body regions 212a and 212b. The P-type doped region 210a and 210b may be contiguous to the first N-type doped region 206a and 206b, respectively. In an embodiment, the P-type doped region 210a and 210b are implanted by boron.

The gate structure 204a disposed on the substrate 200 is, for example, located on the deep N-well region 202 between the second N-type doped region 208 and the first N-type doped region 206a. The gate structure 204a includes a gate 214a, a gate dielectric layer 216a and spacers 218a. The gate dielectric layer 216a is disposed between the gate 214a and the substrate 200, and the spacers 218a are disposed on the sidewalls of the gate 214a and of the gate dielectric layer 216a. Similarly, the gate structure 204b disposed on the substrate 200 is, for example, located on the deep N-well region 202 between the second N-type doped region 208 and the first N-type doped region 206b. The gate structure 204b includes a gate 214b, a gate dielectric layer 216b and spacers 218b. The gate dielectric layer 216b is disposed between the gate 214b and the substrate 200, and the spacers 218b are disposed on the sidewalls of the gate 214b and of the gate dielectric layer 216b. In an embodiment, the gate structures 204a and 204b extend over a portion of the P-body regions 212a and 212b, respectively. In other words, the portion of the P-body regions 212a and 212b electrically coupled with the gate structures 204a and 204b form channel regions 220.

Besides, the LDNMOS devices 10 and 20 may be electrically connected to each other via an extension part 214c connecting the terminals of the gates 214a and 214b, and thereby a two-finger configuration as shown in FIG. 2A. Certainly, in other embodiments, when there are a plurality of LDNMOS devices included, gate electrodes of the LDNMOS devices can be connected to one another to form a multi-finger configuration.

As shown in FIGS. 2A and 2B, the LDNMOS devices 10 and 20 can further include N-type lightly doped regions 222a and 222b, N-drift regions 224a and 224b, and isolation structures 226, 228a, 226b and 228b, respectively.

The N-type lightly doped regions 222a and 222b are respectively configured in the P-body regions 212a and 212b, and electrically connected with the first N-type doped regions 206a and 206b at one side of the gate structures 204a and 204b, so as to avoid the hot carrier effect. The N-type lightly doped region 222a is, for example, disposed between the gate electrode 204a and the first N-type doped region 206a. The N-type lightly doped region 222b is, for example, disposed between the gate electrode 204b and the first N-type doped region 206b.

The isolation structure 226a is disposed between the gate structure 204a and the second N-type doped region 208, and the isolation structure 226b is disposed between the gate structure 204b and the second N-type doped region 208. In an embodiment, a portion of the gates 214a and 214b may further cover the isolation structures 226a and 226b, respectively. The isolation structures 226a and 226b can be field oxide (FOX) structures or shallow trench isolation (STI) structures.

The N-drift regions 224a and 224b are configured in the deep N-well region 202. The N-drift regions 224a and 224b respectively surround the peripheries of at least a portion of the isolation structures 226a and 226b, and electrically connect with the second N-type doped region 208. In an embodiment, the N-drift regions 224a and 224b are implanted by arsenic, and the energy of implantation is about 100 keV-200 keV with the dosage of about $5 \times 10^{11}/cm^2$-$10^{13}/cm^2$. In this exemplary example, the energy of implantation for forming the N-drift regions 224a and 224b is about 150 keV, and the dosage thereof is about $4 \times 10^{12}/cm^2$.

The isolation structure 228a is disposed between the P-body region 212a and the P-well region 203, and the isolation structure 228b is disposed between the P-body region 212b and the P-well region 203. That is to say, the LDNMOS device 10 is deployed in the region defined by the isolation structures 226a and 228a, while the LDNMOS device 20 is deployed in the region defined by the isolation structures 226b and 228b. The isolation structures 228a and 228b can be FOX structures or STI structures.

Moreover, the semiconductor device in the present invention can further include a P-type guard ring 230 configured in the P-well region 203. The P-type guard ring 230 may be a P+ doped region configured outside the deep N-well region 202 and surrounding the profile of the deep N-well region 202, so as to prevent the noise from being propagated to the other arrays. The doping concentration of the P-type guard ring 230 is higher than that of the P-well region 203. In an embodiment, the P-type guard ring 230 is implanted with boron. The isolation structure 228a is disposed between the P-type guard ring 230 and the P-type doped region 210a, and the isolation structure 228b is disposed between the P-type guard ring 230 and the P-type doped region 210b, for example.

It is noted that the semiconductor device in the present invention further includes an N-type isolation ring 232 configured in the deep N-well region 202, as shown in FIGS. 2A and 2B. The N-type isolation ring 232 is configured inside the deep N-well region 202 and corresponds to the edge of the deep N-well region 202. In an embodiment, the N-type isolation ring 232 can be deployed under the isolation structure 228a and 228b.

The doping concentration of the N-type isolation ring 232 is higher than that of the deep N-well region 202. The N-type isolation ring 232 may be implanted with phosphorus or arsenic. In an embodiment, when the dopant introduced is phosphorus, the N-type isolation ring 232 may be formed by implanting the dopant into the substrate 200 at the energy of implantation within a range of about 150 keV-270 keV, possibly 210 keV, and the dosage thereof within a range of about $10^{12}/cm^2$-$10^{14}/cm^2$, possibly $1.4 \times 10^{13}/cm^2$. In another embodiment, when the dopant introduced is arsenic, the N-type isolation ring 232 may be formed by implanting the dopant into the substrate 200 at the energy of implantation within a range of about 100 keV-200 keV, possibly 150 keV, and the dosage thereof within a range of about $5\times10^{11}/cm^2$-$10^{13}/cm^2$, possibly $4\times10^{12}/cm^2$.

The N-type isolation ring 232 is deployed within the border of the deep N-well region 202 for surrounding the LDNMOS devices 10 and 20, and the doping concentration of the N-type isolation ring 232 is higher than that of the deep N-well region 202. Accordingly, the leakage current from the P-body regions 212a and 212b to the substrate 200 can be prevented by the disposition of the N-type isolation ring 232, and thereby the N-type isolation ring 232 can isolate the lateral leakage effectively so as to enhance high side ability and the performance of the device.

Figure 4:
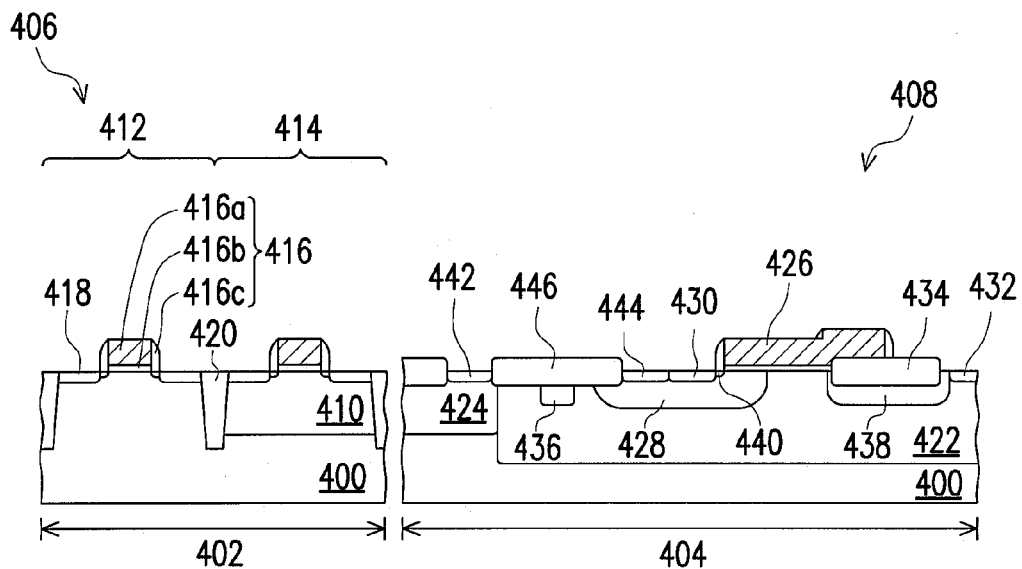
FIG. 4 is a schematic, cross-sectional diagram of an IC chip according to an embodiment of the present invention.

It is noted that the fabricating process of the LDNMOS device described above may be integrated with that of the CMOS device, so as to simplify manufacturing procedures. Therefore, in the following embodiments, the CMOS device and the LDNMOS device are incorporated on the same substrate to illustrate the IC chip in the present invention. FIG. 4 is a schematic, cross-sectional diagram of an IC chip according to an embodiment of the present invention.

Referring to FIG. 4, the IC chip in the present invention includes at least a CMOS device and an LDNMOS device. For illustration purposes, a CMOS device 406 and an LDNMOS device 408 disposed on a P-type substrate 400 as shown in FIG. 4 are illustrated only as an exemplary example, which is not to be construed as limiting the present invention. The CMOS device 406 is disposed in the first area 402 of the substrate 400, and the LDNMOS device 408 is disposed in the second area 404 of the substrate 400. The first area 402 and the second area 404 are separated from each other.

The CMOS device 406 includes an N-well region 410, an NMOS transistor 412, and a PMOS transistor 414. The N-well region 410 is configured in the substrate 400. The NMOS transistor 412 is disposed on the substrate 400 outside of the N-well region 410. The PMOS transistor 414 is disposed on the substrate 400 of the N-well region 410. An isolation structure 420 is disposed between the NMOS transistor 412 and the PMOS transistor 414, for example. In an embodiment, each of the NMOS transistor 412 and the PMOS transistor 414 may include a gate structure 416 located on the substrate 400, and doping regions 418 located in the substrate 400 at both sides of the gate structure 418. The gate structure 416, for example, includes a gate 416a, a gate dielectric layer 416b and spacers 416c. The gate dielectric layer 416b is disposed between the gate 416a and the substrate 400, and the spacers 416c are disposed on the sidewalls of the gate 416a and of the gate dielectric layer 416b.

The LDNMOS device 408 can be the LDNMOS device shown in FIG. 2B, for example. The LDNMOS device 408 may include a deep N-well region 422, a P-well region 424, a gate structure 426, a P-body region 428, a first N-type doped region 430, a second N-type doped region 432, an isolation structure 434 and an N-type isolation ring 436. The deep N-well region 422 and the P-well region 424 are configured in the substrate 400, wherein the P-well region 424 surrounds the periphery of the deep N-well region 422. The gate structure 426 is disposed on the substrate 400 of the deep N-well region 422. The P-body region 428 is configured in the deep N-well region 422 at one side of the gate structure 426. The first N-type doped region 430 is configured in the P-body region 428. The second N-type doped region 432 is configured in the deep N-well region 422 at the other side of the gate structure 426. The isolation structure 434 is disposed between the gate structure 426 and the second N-type doped region 432. The N-type isolation ring 436 is configured in the deep N-well region 422 and corresponding to an edge of the deep N-well region 422, wherein the doping concentration of the N-type isolation ring 436 is higher than that of the deep N-well region 422.

In an embodiment, the LDNMOS device 408 can further includes an N-drift region 438, an N-type lightly doped region 440, a P-type guard ring 442, an isolation structure 444 and a P-type doped region 446. The N-drift region 438 is configured under the isolation structure 434. The N-type lightly doped region 440 is configured between the gate structure 426 and the first N-type doped region 430. The P-type guard ring 442 is configured in the P-well region 424 and surrounds the deep N-well region 422. The doping concentration of the P-type guard ring 442 is, for example, higher than that of the P-well region 424. The isolation structure 446 is disposed between the P-body region 428 and the P-well region 424, whole the N-type isolation ring 436 is, for example, configured under the isolation structure 446. The P-type doped region 444 is configured in the P-body region 428 and contiguous to the first N-type doped region 430.

As shown in FIG. 4, it is noticed that the N-type isolation ring 436 and the N-drift region 438 can be formed in the same fabricating process. In other words, the dopant introduced, the doping concentration and the doping depth of the N-type isolation ring 436 are substantially identical to those of the N-drift region 438, respectively. In an embodiment, the N-type isolation ring 436 and the N-drift region 438 may be implanted by arsenic at the energy about 100 keV-200 keV and the dosage about $5\times10^{11}/cm^2$-$10^{13}/cm^2$. In this exemplary example, the energy of implantation for forming the N-type isolation ring 436 and the N-drift region 438 is about 150 keV, and the dosage thereof is about $4\times10^{12}/cm^2$.

Figure 5:
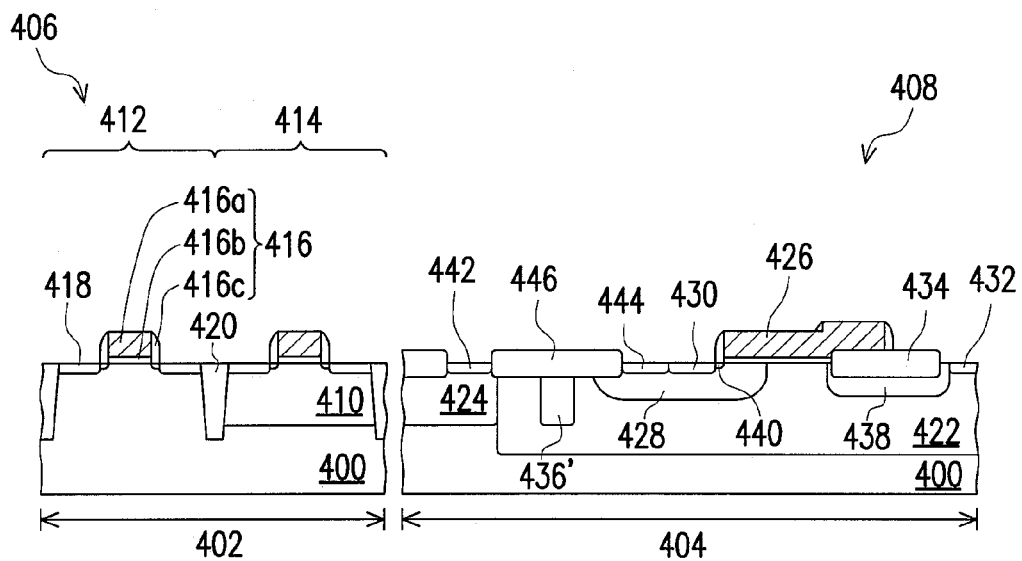
FIG. 5 is a schematic, cross-sectional diagram of an IC chip according to another embodiment of the present invention.

FIG. 5 is a schematic, cross-sectional diagram of an IC chip according to another embodiment of the present invention. The identical elements shown in FIGS. 4 and 5 are designated with the same reference numbers, and detailed descriptions of the same or like elements are omitted hereinafter.

Referring to FIG. 5, the constructing elements of the IC chip are roughly identical to those shown in FIG. 4, while the difference lies in the dopant introduced, the doping concentration and the doping depth of the N-type isolation ring 436'. The N-type isolation ring 436 and the N-well region 410 may be formed in the same fabricating process. In other words, the dopant introduced, the doping concentration and the doping depth of the N-type isolation ring 436' are substantially identical to those of the N-well region 410, respectively. In another embodiment, the N-type isolation ring 436' and the N-well region 410 may be implanted by phosphorus at the energy about 150 keV-270 keV and the dosage about $10^{12}/cm^2$-$10^{14}/cm^2$. In this exemplary example, the energy of implantation for forming the N-type isolation ring 436' and the N-well region 410 is about 210 keV, and the dosage thereof is about $1.4\times10^{13}/cm^2$.

In FIGS. 4 and 5, the N-type isolation ring 436 or 436' is configured in the deep N-well region 422 to surround the LDNMOS device 408, and thereby the lateral leakage current from the P-body region 428 to the substrate 400 can be avoided efficiently. Moreover, formation of the N-type isolation ring 436 or 436' can be integrated with the current CDMOS process; that is, the N-type isolation ring 436 or 436' can be formed by forming the implantation mask and performing the ion implantation.

The following example is provided to prove that the semiconductor device and the IC chip in the present invention can enhance the performance of the device. This example is provided to illustrate effects upon the leakage current made by the deployment of the N-type isolation ring, but is not intended to limit the scope of the present invention.

Example

Figure 6:
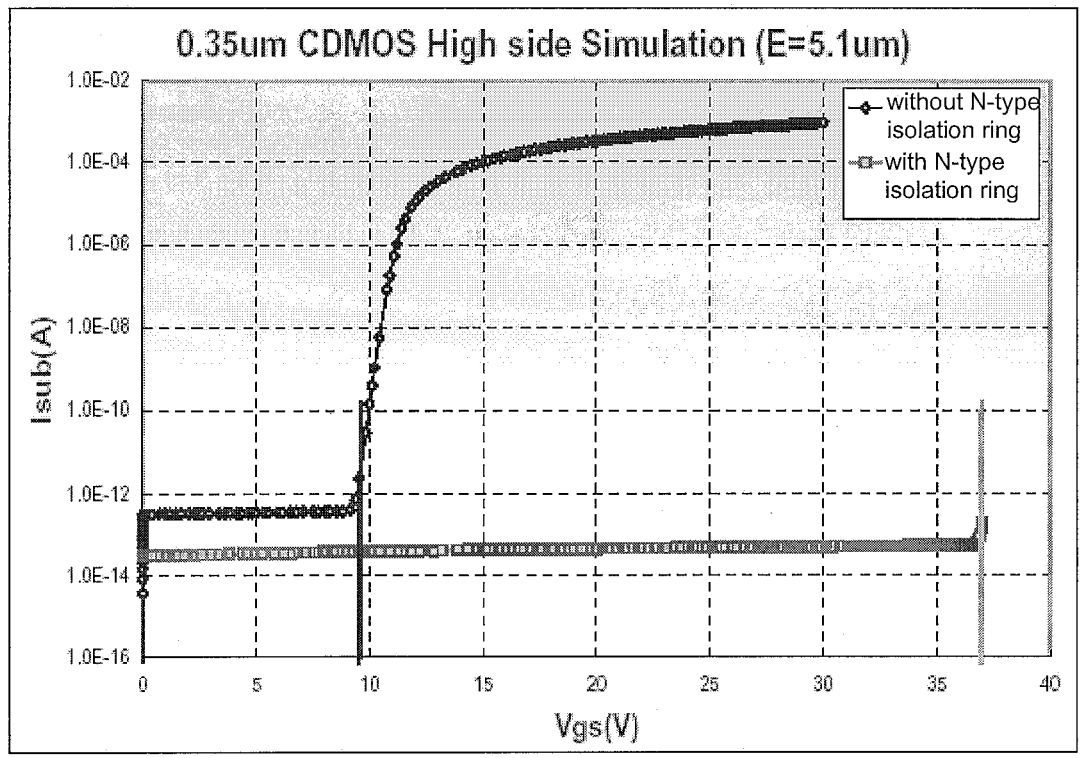
FIG. 6 schematically illustrates a chart of gate voltage ($V_{gs}$) vs. substrate current ($I_{sub}$) according to an example of the present invention.

FIG. 6 schematically illustrates a chart of gate voltage ($V_{gs}$) vs. substrate current ($I_{sub}$) according to an example of the present invention.

In this example, the 0.35 µm 3.3/5/40 V CDMOS process with 5.1 µm (E=5.1 µm) between the P-body region and the edge of the deep N-well region is illustrated as an exemplary demonstration. The N-type isolation ring is formed between the source of the LDNMOS and the P-type substrate by the same formation process of N-well region. As shown in FIG. 6, the LDNMOS without N-type isolation ring has a breakdown at the gate voltage in about 9.5 V, and thereby the rapid increasing substrate current induces the device failure. The other curve in FIG. 6 expresses the LDNMOS with the N-type isolation ring can bear the gate voltage up to 35 V. Even the gate voltage exceeds 35 V, the LDNMOS does not breakdown and still keep the stable substrate current in extremely low level, so as to promise the stability of the LDNMOS.

In view of the above, the semiconductor device and the IC chip in the present invention include the N-type isolation ring configured within the border of the deep N-well region, wherein the doping concentration of the N-type isolation ring is higher than that of the deep N-well region. Since the N-type isolation ring surrounds the device, the leakage current can be prevented effectively, thereby enhancing high side ability and the performance of the device.

Moreover, the semiconductor device and the IC chip in the present invention can be applicable to all power management ICs, and rely on a single process through the modification of the photomask pattern so as to easily be integrated with the current CDMOS process. Hence, not only the process is simple, the chip surface area can be more effectively utilized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
a deep N-well region, configured in a substrate;
a P-well region, surrounding a periphery of the deep N-well region;
a gate structure, disposed on the substrate of the deep N-well region, wherein the gate structure comprises a gate and a gate dielectric layer;
a second N-type doped region, configured in the deep N-well region at one side of the gate structure;
a first isolation structure, disposed between the gate dielectric layer and the second N-type doped region;
an N-type isolation ring, configured in the deep N-well region and corresponding to an edge of the deep N-well region, wherein a doping concentration of the N-type isolation ring is higher than a doping concentration of the deep N-well region;
a P-body region, configured in the deep N-well region at one side of the gate structure and between the gate structure and the N-type isolation ring;
a first N-type doped region, configured in the P-body region; and
an N-type lightly doped region, configured between the gate structure and the first N-type doped region.

2. The semiconductor device according to claim 1, further comprising an N-drift region, configured under the first isolation structure.

3. The semiconductor device according to claim 1, further comprising a P-type guard ring, configured in the P-well region.

4. The semiconductor device according to claim 3, wherein a doping concentration of the P-type guard ring is higher than a doping concentration of the P-well region.

5. The semiconductor device according to claim 1, further comprising a second isolation structure, disposed between the P-body region and the P-well region.

6. The semiconductor device according to claim 5, wherein the N-type isolation ring is configured under the second isolation structure.

7. The semiconductor device according to claim 1, wherein the N-type isolation ring is doped with phosphorus or arsenic.

8. The semiconductor device according to claim 1, further comprising a P-type doped region, configured in the P-body region and contiguous to the first N-type doped region.

9. A semiconductor device, comprising:
a deep N-well region, configured in a substrate;
a P-well region, surrounding a periphery of the deep N-well region;
a P-type guard ring, configured in the P-well region;
a gate structure, disposed on the substrate of the deep N-well region, wherein the gate structure comprises a gate and a gate dielectric layer;
a second N-type doped region, configured in the deep N-well region at one side of the gate structure;
a first isolation structure, disposed between the gate dielectric layer and the second N-type doped region;
an N-type isolation ring, configured in the deep N-well region and corresponding to an edge of the deep N-well region, wherein a doping concentration of the N-type isolation ring is higher than a doping concentration of the deep N-well region;
a P-body region, configured in the deep N-well region at one side of the gate structure and between the gate structure and the N-type isolation ring; and
a first N-type doped region, configured in the P-body region.

10. The semiconductor device according to claim 9, further comprising an N-drift region, configured under the first isolation structure.

11. The semiconductor device according to claim 9, further comprising an N-type lightly doped region, configured between the gate structure and the first N-type doped region.

12. The semiconductor device according to claim 9, wherein a doping concentration of the P-type guard ring is higher than a doping concentration of the P-well region.

13. The semiconductor device according to claim 9, further comprising a second isolation structure, disposed between the P-body region and the P-well region.

14. The semiconductor device according to claim 13, wherein the N-type isolation ring is configured under the second isolation structure.

15. The semiconductor device according to claim 9, wherein the N-type isolation ring is doped with phosphorus or arsenic.

16. The semiconductor device according to claim 9, further comprising a P-type doped region, configured in the P-body region and contiguous to the first N-type doped region.

* * * * *